(12) United States Patent
Dutta

(10) Patent No.: US 7,975,378 B1
(45) Date of Patent: *Jul. 12, 2011

(54) METHOD OF MANUFACTURING HIGH SPEED PRINTED CIRCUIT BOARD INTERCONNECTS

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/683,356

(22) Filed: Jan. 6, 2010

(51) Int. Cl.
*H05K 3/36* (2006.01)

(52) U.S. Cl. ........... 29/830; 29/832; 29/840; 29/852; 174/255; 333/238

(58) Field of Classification Search .......... 29/830, 29/832, 840, 852; 174/255; 333/238
See application file for complete search history.

(56) References Cited

U.S. PATENT DOCUMENTS

| | | | | |
|---|---|---|---|---|
| 6,875,921 B1* | 4/2005 | Conn | | 174/534 |
| 7,663,064 B2* | 2/2010 | Dutta et al. | | 174/261 |
| 7,719,105 B2* | 5/2010 | Dutta | | 257/700 |
| 7,755,445 B2* | 7/2010 | Dutta et al. | | 333/1 |

* cited by examiner

*Primary Examiner* — C. J Arbes

(57) ABSTRACT

Described are methods for fabricating high speed metallic electrical interconnects for printed wiring board for high speed transmission of a data signal across an interconnect in a systems. The trench under electrical signal line is made using the separate dielectric layer having through holes opened through that said dielectric layer and aligned with electrical signal line. The layer with through holes aligned with electrical signal line sandwiched in between layer carrying the electrical signal line and a layer carrying ground conducting line for the case of microstrip-type transmission line. The two separate layers with the through-holes opened and aligned with the electrical signal line are needed for the stripline-type transmission line. Multi-layers board having high speed electrical signal lines can be made utilizing the configuration described.

20 Claims, 12 Drawing Sheets

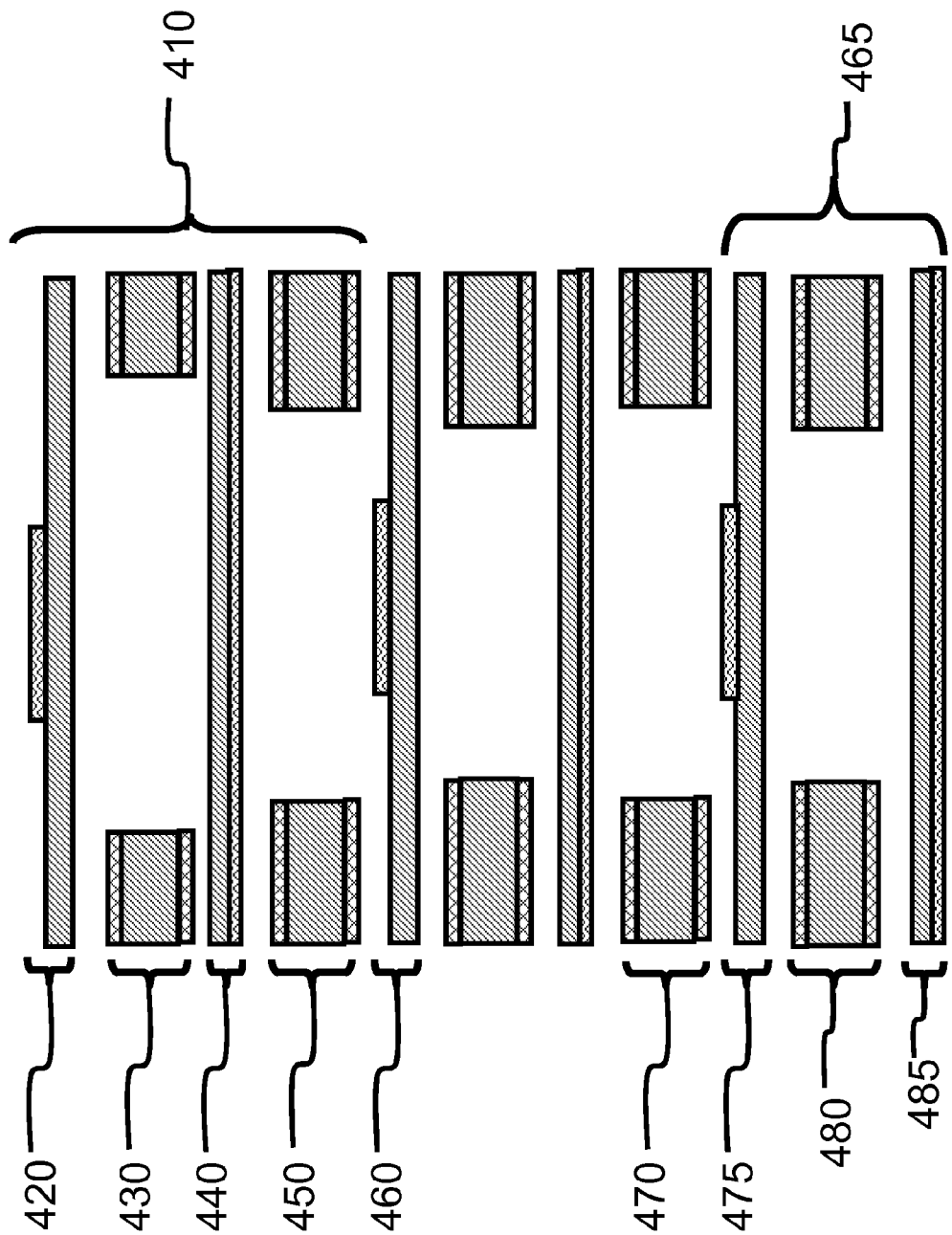

(B) 10Gb/s Eye-pattern response after 1.5 meter FR4 based PCB according to this invention (A) 10 Gb/s PRBS Signal to Board (B) 10Gb/s Eye-pattern response after 1.5 meter FR4 based standard PCB (A) 10Gb/s PRBS Signal to Board

METHOD OF MANUFACTURING HIGH SPEED PRINTED CIRCUIT BOARD INTERCONNECTS

STATEMENT REGARDING FEDERALLY SPONSORED RESEARCH OR DEVELOPMENT

This invention was made with Government support under contract no. W31P4Q-06-C-0106 awarded by US Army Aviation and Missile Command. The Government has certain rights in the invention.

CROSS-REFERENCE TO RELATED APPLICATIONS

Not Applicable

FIELD OF THE INVENTION

The present invention relates to an innovative, high-speed, chip-to-chip interconnection technology. More specifically, the invention provides a method of manufacturing interconnects that reduces the disparity between off-chip and on-chip signal speeds in a cost-effective and reliable way. The invention discloses a method to manufacture interconnects with lower dielectric constants and lower dielectric loss, which is implemented into printed circuit board (PCB) technology.

BACKGROUND OF THE INVENTION

The increasing level of integration within an electrical integrated circuit (IC) leads to both higher data rates and larger number of IC interconnections. The inherent signal speed has recently increased to 3 GHz with indications that it will reach 10 GHz and beyond in the future. The number of pin connections is also increasing. A single IC now requires close to 2000 connections with indications that this number will increase towards 5000-plus.

In conventional PCBs, an electric signal dissipates while propagating through a signal line. The signal dispersion is proportional to the signal frequency. The higher the signal frequency the lower the bandwidth of the signal line used for connecting one chip to another on the board. The tangent loss of the dielectrics are high, the bandwidth of the interconnects gets limited to the point that the high speed signal cannot be sent over a longer distance compared to dielectrics with lower tangent loss.

The interconnect technology associated with this increasing level of integration cannot keep up. With the continued growth in integration density of complementary metal-oxide semiconductor (CMOS) technology and the clock frequency of chips (e.g. microprocessors), the aggregate bandwidth required between future generation chips and chipsets is increasing sharply. Microwave circuits require substrate materials that have tight control of dielectric constants as well as low loss tangents. Today's printed circuit boards (PCBs) are made of uniform epoxy-glass composite material (Trade name: FR4). The FR4 technology is well known to be reliable and cost effective. FR4 has material characteristics, however, which limit usage in high speed applications when using conventional interconnection structure. This is because FR4 has high dielectric loss which limits the bandwidth of the interconnects. As signal rates and pin counts continue to rise, the disparity between off-chip and on-chip signal speeds will also continue to rise.

High frequency materials for use in off-chip interconnection technology are known. Alumina, Polytetrafluoroethylene (PTEF), Duroid, Rogers 4003, and GTEK all bridge the gap by providing low loss tangents and tight control on dielectric constants, but with a high manufacturing cost associated. The cost of implementing the production of new material in the PCB fabrication process is estimated to be more than ten times the conventional methods. The new materials are also incompatible with conventional FR4 processing, further increasing the cost.

In sum, the conventional PCB technology used for off-chip interconnection is not feasible with increasing signal speeds. Existing conventional electrical interconnects can only achieve a certain level of bandwidth. Beyond this level, the development of a completely new manufacturing technology is needed. Current solutions have proven too costly for the PCB industry.

BRIEF DESCRIPTION OF THE DRAWINGS

FIG. 4B depicts the cross sectional view of the stacking process for creating mulit-layered high speed printed circuit board interconnects.

DEFINITIONS

Figure 1:
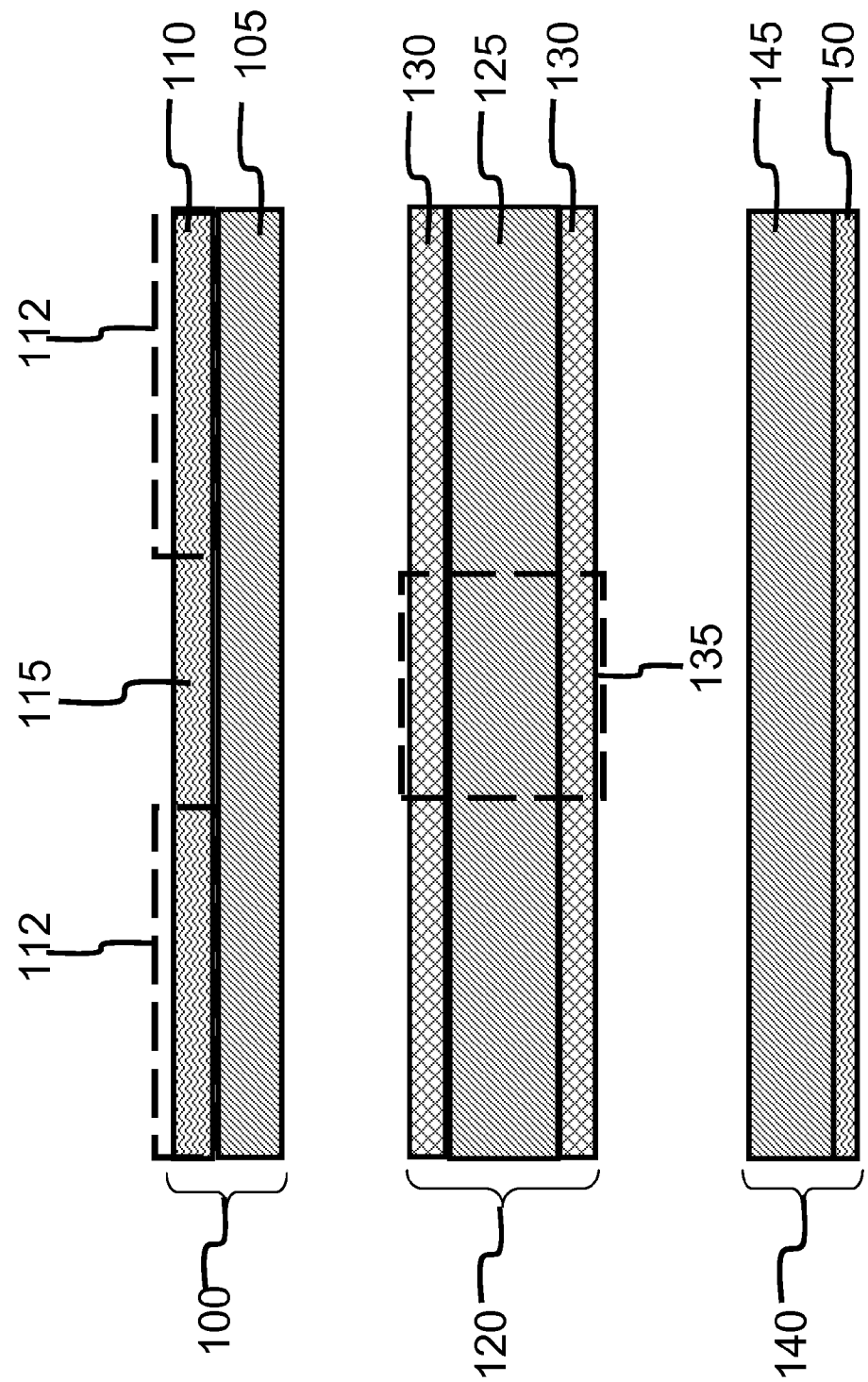
FIG. 1 depicts the three design layers used in the method for manufacturing high speed printed circuit board interconnects.

As used in this specification and the appended claims, the singular forms "a," "an" and "the" include plural referents unless the context clearly dictates otherwise. Thus, for example, reference in the claims to "a signal line" does not preclude the possibility of more than one signal line.

As used in this specification and the appended claims, when referring to the signal line and trench patterns, the term "match" or "matches" means only that the patterns follow substantially similar pathways. The term is not intended to mean that the signal lines or trenches necessarily have the same or similar widths, or thicknesses.

DETAILED DESCRIPTION OF THE PREFERRED EMBODIMENTS

In the following detailed description of the preferred embodiments, reference is made to the accompanying drawings, which form a part hereof and in which is shown by way of illustration specific preferred embodiments in which the inventions may be practiced. These embodiments are described in sufficient detail to enable those skilled in the art to practice the invention and it is to be understood that other embodiments may be utilized. The following detailed description is, therefore, not to be taken in a limiting sense, and the scope of the present invention is defined only by the appended claims.

The invention is directed at a method of manufacturing innovative metallic interconnect technology in conventional PCBs for chip-to-chip interconnects with 5 Gb/s and higher signal speeds. The interconnects comprise innovative transmission lines which carry the signals through signal lines from one electronic chip to another. The interconnect system reduces the tangent-loss of the dielectric system based on purely passive techniques independent of the signal modulation format. The transmission line, having pre-designed characteristic impedance, consists of a dielectric system and a metal conductor. Using an open trench (or backside slot) under the signal line helps to reduce microwave-loss caused by the dielectric material and hence increases the signal carrying capacity. Interconnect bandwidth can be controlled by selecting the physical parameters of the trench and interconnect width.

According to the invention, based on the interconnect structure design, the effective dielectric loss and effective dielectric constant of the interconnect system can be controlled. This adds many features in the interconnection such as varying the phase velocity, varying the bandwidth of the interconnect, and adjusting the skews of the signal in the single interconnect system. According to a preferred embodiment, the speed of the signal in the signal line can be made to the speed of the light in the air, if other losses due to the signal line structure such as the electrode parameter (resistance, capacitance) are neglected. The bandwidth of the electronic interconnect system can possibly match or exceed that of optical fibers. This invention covers all high-speed interconnects in which embedded signal lines are used.

According to this invention, the method of manufacture covers all high speed metallic interconnects using single or plurality of dielectric layers with a backside, opened-trench or slot under the high speed signal line. The embodiments described in the FIGS. 1-8 are meant to be illustrative embodiments and examples of testing results. FIGS. 1-8 are not meant to limit the amount of layers available in a multi-layered PCB interconnect structure or the performance capability of structures manufactured by the claimed methods.

According to the present invention, it is the object to control the propagation of the electrical field significantly inside the trench or slot, (by filling with air, low loss dielectric constant material or a coolant) which thereby increases the bandwidth of the interconnection system and reduces the signal propagation delay. In the embodiments described below, reference is often made to strip-line and microstrip line configurations as a means of describing the structures created by the method of manufacture. The method also covers other single or multiple signal lines in other configurations such as coplanar-line configurations. Signal lines could be signal or differential lines.

The effective dielectric constant of the interconnect system is also decreased, reducing the signal propagation delay between the channel. The described open trench formed in the dielectric material may be an air-void, under vacuum, filled with a liquid coolant material, or filled with a low dielectric constant material. When the open trench is filled with a liquid coolant, a flow must be established in order to draw heat away from the signal lines and interconnects. The flow can be contained within the interconnects, utilizing a coolant that circulates the liquid as it reaches a certain temperature. The flow can also be connected through the entire system The metallic interconnects are passive circuits and transparent to any signal modulation format. The interconnect utilizes a transmission line configuration whose insertion loss is minimized artificially by reducing the microwave loss of the substrate. This is done by using an air-void (or low dielectric) under and along the signal line. The interconnects also utilize standard board material (e.g. FR4, Kapton and the like) and standard manufacturing technology.

The invention has applications across broad segments of defense and commercial electronic equipment. The interconnects have numerous civilian and defense applications for example radio frequency (RF) systems to digital systems. The full benefits for increasing the interconnect bandwidth are best achieved in high speed systems. Two major segments in particular would realize the breadth of potential applications, computational machines and communication equipment.

Some examples of applications in the defense market include next generation high speed computing, imaging, communication, and multifunctional RF systems. Utilizing the metallic interconnects can make the system realize low-power, high-speed, and low-cost applications.

The metallic interconnects increase bandwidth and functionality in a variety of commercial applications as well. IT equipment covering next generation PC's, servers, wireless, and mobile systems all have the potential to be positively impacted by the interconnects. Gaming devices where a high bandwidth is required to communicate between the CPU, graphic chip, and memory as well as interactive gaming functionalities will also be positively impacted.

The concept of high bandwidth metallic signal line can be extended to any kind of metallic interconnect that connects two or more electronic means, covering off-chip (board level interconnects) and also on-chip metallic interconnects. This concept will provide a significant level of speed and signal enhancement by using conventional material such as FR4. On-chip speed can be maintained while communicating with other chips on the board. The interconnects utilize the open trench under the signal line to reduce the effective dielectric loss to increase signal capacity.

In each embodiment of this invention reference is made generally to three materials: a conducting metal, a dielectric material, and a no-flow or low-flow prepreg. The conducting metal used is normally copper but can be other conducting materials including silver, gold, and aluminum. The dielectric material is mentioned in an object to cover all materials which show dielectric properties. In general these can be FR4, Kapton, other dielectric polymers, or other materials with dielectric properties. These polymers and materials include ceramic materials such as Duroid, AlN, $Al_2O_3$, Mullite (3 $Al_2O_3$: 2 $SiO_2$), SiC, $SiO_2$, Silicon nitride, Silicon carbide, Silicon-Oxy-Nitride, BeO, Cordierite (magnesium alumina silicate), BN, Glass (with different compositions), polyimide, epoxy-glass, FR4, CaO, MnO, $ZrO_2$, PbO, alkali-halide (e.g. NaBr, NaCl, etc.), RO4000 and similar materials made by Rogers Corporation, semiconductors (e.g. Silicon, Silicon-germanium, Silicon Carbide, Gallium Arsenide, Gallium antimonide, Indium Phosphide, etc.) and all polyimides and benzocyclobutenes (BCBs) having dielectric properties. All polymer materials having dielectric properties also fall under the nomenclature of dielectric materials. These dielectric materials can be made using high temperature ceramics processing or using an IC fabrication process. Polymer dielectric materials also include, but are not limited to, Teflon, liquid crystal polymer, epoxy, parylene, silicone-polyimide, silicone-gel, and fluorinated ethylene propylene copolymer. It also includes elastomers (e.g. silicone elastomer), monomers, and gels. All standard polymers are generally available from standard polymer manufacturers, for example DuPont, Hitachi-Chemical, Mitsui, and Mitsubishi-Chemical Industries. For adhesive materials the no-flow or low-flow prepreg materials are resin and epoxy materials, providing a binding functionality while maintaining consistency when subjected to heat and pressure. Conventional available adhesive materials are marketed by DuPont, Hitachi-Chemical, Mitsui, and Mitsubishi-Chemical Industries, etc. The adhesive type can be low-flow or no-flow in order to prevent adhesive from flowing into the trenches under stacking pressures and temperatures. Certain embodiments also make use of a flow prepreg in areas which do not require that the bonding material maintain consistency (i.e. the binding of two substructures further described below). The three materials are then either stacked together, formed into substructures which are then stacked together, or some combination of the two. The final step of pressing, laminating, and sintering the layers or substructures together may be done in vacuum, under pressure, or under atmospheric conditions. The manufacturing temperature for this process is within 80 degrees C. and 750 degrees C., with an optimal range of 120 and 600 degrees C.

According to the invention, a high speed PCB for interconnection is manufactured with, (i) single or multiple electrical signal lines for carrying the electrical signal from one electronics element to another and vice-versa for electrical communication; (ii) single or multiple dielectrics which are stacked by a no-flow or low-flow prepreg (epoxy) wherein the dielectric system carrying the signal lines has a structure comprising a through hole that creates a trench with specified deepness and width and located under the signal line (conducting metal); (iii) a ground or power line located on the opposite side of the dielectrics wherein the shape of the back slot or trench could be rectangular, square or any shape convenient for manufacturing, covering the some or all of the metal conductor carrying the signal.

According to this invention, manufacture of high speed PCB interconnects comprises, (i) formation of first single or multiple core (i.e. dielectric) layers having a conducting metal layer on one side; (ii) making the signal lines in the single or multiple core layers; (iii) opening a through hole which will act as the trench when attached with the first core layer with metallic layer, the trench is located at the opposite side of the signal lines located on the first core layer, wherein the trench depth (which is the core layer thickness in which the through hole is made) is determined from the bandwidth required for the interconnects and the trench width is determined based on manufacturing convenience and/or the bandwidth requirement; (iv) formation of the low-flow or no-flow prepreg (epoxy) to allow for stacking of the core layers; (v) hot press and lamination for stacking the sheets, and; (vi) sintering under a specified temperature.

The process for PCB interconnect manufacture having the signal line of microstrip line configuration comprises (i) a first core layer formation having a conducting metal layer on one side; (ii) making the signal lines in the first core layer; (iii) opening a through hole which will act as the trench when attached with the first core layer with signal lines, the trench is located at the opposite side of the signal lines located on the first core layer, wherein the trench depth (which is the core layer thickness in which the through hole is made in the second core layer) is determined from the bandwidth required for the interconnects and the trench width is determined based on manufacturing convenience and/or the bandwidth requirement; (iv) formation of the no-flow or low-flow prepreg (epoxy) layer to allow for stacking of two core layers to make microstrip line type signal lines; (v) second core layer formation having a conducting metal layer on one side; (vi) hot press and lamination for stacking the first core layer and the second core layer, and; (vii) sintering under temperature.

The process for PCB interconnect manufacture having a stripline type configuration for the signal line comprises (i) first core layer formation having a conducting metal on only one side; (ii) making the signal lines in the first core layer; (iii) opening a through hole which will act as the trench when attached with the first core layer with metallic layer, the trench is located at the opposite side of the signal lines located on the first core layer, wherein the trench depth (which is the core layer thickness in which the through hole is made) is determined from the bandwidth required for the interconnects and the trench width is determined based on manufacturing convenience and/or the bandwidth requirement; (iv) formation of a second core layer having a uniform conducting metal layer on one side; (v) opening a through hole which will act as the trench when attached with the second core layer, the trench is located at the opposite side of the signal lines located on the core layer with metallic layer, wherein each trench position is the same as that made in the first core layer, wherein the trench depth (which is the core layer thickness in which the through hole is made) is determined from the bandwidth required for the interconnects and the trench width is determined based on manufacturing convenience and/or the bandwidth requirement; (vi) formation of a third core layer with a uniform conducting metal layer on one side; (vii) formation of two no-flow or low-flow prepreg (epoxy) layers to allow for stacking of the core layers; (viii) hot press and lamination for stacking the second core layer.

In one embodiment of the method for manufacture includes the use of three layers to construct a trench. The top layer, where the signal line lies, comprises single-sided dielectric material (for example FR4, Kapton, or other dielectric polymers) combined with a conducting metal. The middle layer comprises a dielectric polymer with no-flow or low-flow adhesive on either side. Cutting a hole out of the second layer which extends for the length of the layer and then stacking of the first and second layers provides the trench functionality. The bottom PCB is either a single or double sided, 1 Oz Copper coupled with a dielectric polymer layer. The thin layer of no-flow or low-flow prepreg connects the top and middle PCB to the lower PCB.

When cutting the through-hole or carving a trench, a $CO_2$ laser or YAG laser can be used. Electro Scientific Industries (ESI) markets the UV via machine that can etch at 30,000 vias per minute. Aligning can be done using infared imaging analysis, which shows the metal pattern (signal lines) in the opposite side of the dielectric material. A milling machine provides another method of laminate removal. MITS Electronics in Tokyo, Japan markets a milling machine which can create the trench in the manufactured PCB. The machine has control in the X, Y, and Z directions. The instrument can drill according to a designed trace.

In another embodiment a method for manufacturing a multilayered board is described. Stacking the materials greatly simplifies the manufacturing process which translates into cost reduction and eliminates impedance variation (due to trench depth variation). The trench can be opened using a laser drilling technique, often used in current PCB processes. Another method for opening a trench includes using a combination of no-flow or low-flow adhesive and a layer of dielectric drilled together, then stacking another layer of dielectric on top. A dielectric material is also used to support the signal line found inside the trench. For multi-layered boards with signal lines in different layers, the conventional PCB process using sub-assemblies is used with adjustments made to account for the present invention.

The present invention describes a method for manufacturing high speed printed circuit board interconnects with microstrip line configuration comprising: (i) forming a signal line layer containing a first dielectric material and a conducting metal, the dielectric material can be FR4, Kapton, other dielectric polymers, or other materials with dielectric properties; (ii) etching the conducting metal to form at least one signal line pattern in the signal line layer; (iii) forming a trench layer containing a second dielectric material and a no-flow or low flow prepreg material, the second dielectric material can be the same material as the first dielectric material or a different material and can be FR4, Kapton, or other dielectric polymers or materials; (iv) carving at least one trench cavity pattern through the trench layer wherein the trench cavity pattern matches a signal line pattern etched in the signal line layer, the trench cavity pattern can be carved using methods described in the above specification; (v) forming a ground layer containing a conducting metal and a third dielectric material, the third dielectric material may be the same or different material as the first dielectric material and/or the second dielectric material and can be FR4, Kapton, or other dielectric polymers or materials; (vi) stacking the signal line, trench, and ground layers such that the signal line layer is adjacent to the trench layer with corresponding trench and signal line patterns and the ground layer completes one end of the stack; and, (vii) pressing, laminating, and sintering the stacked sheets under a specified temperature.

In the trench layer, the no-flow or low-flow prepreg can come attached to the second dielectric material or the prepreg can come as separate pieces combined when the layers are stacked. If the no-flow or low-flow prepreg comes as separate pieces in the trench layer they can be cut at the same width as the trench cut or wider. When heat is applied to the stacked layers the wider cut prepreg material can then fill in the open area between the dielectric material in the trench layer and the dielectric material in the signal line layer, allowing for a full bind of the two layers without filling in the entire open trench area.

The present invention describes a method for manufacturing multi-layered high speed printed circuit board interconnects comprising the steps of: (i) forming a signal line layer containing a first dielectric material and a conducting metal, the dielectric material can be FR4, Kapton, other dielectric polymers, or other materials with dielectric properties; (ii) etching the conducting metal to form at least one signal line pattern in the signal line layer; (iii) forming a trench layer containing a second dielectric material and a no-flow or low flow prepreg material, the second dielectric material can be the same material as the first dielectric material or a different material and can be FR4, Kapton, or other dielectric polymers or materials; (iv) carving at least one trench cavity pattern through the trench layer wherein the trench cavity pattern matches a signal line pattern etched in the signal line layer, the trench cavity pattern can be carved using methods described in the above specification; (v) forming a ground layer containing a conducting metal and a third dielectric material, the third dielectric material may be the same or different material as the first dielectric material and/or the second dielectric material and can be FR4, Kapton, or other dielectric polymers or materials; (vi) arranging the layers in the following order, a signal line layer, a first trench layer, a ground layer and second trench layer wherein the trench pattern of the first trench layer matches the pattern of the signal line in the signal line layer; (vii) stacking the arranged layers together so that the trench pattern in the second trench layer matches the signal line pattern of the subsequent signal line layer; (viii) completing the stacking process, either by adding a pattern comprising a signal line layer, a trench layer, and a ground layer wherein the trench pattern in the trench layer matches the signal line pattern in the signal line layer, or by adding a single signal line layer, with the signal line facing towards the terminal end of the stack and sharing a common ground layer with the last pattern section of the stack; and, (ix) pressing, laminating, and sintering the stacked layers under a specified temperature.

The present invention describes a method for manufacturing multi-layered high speed printed circuit board interconnects comprising the steps of: (i) forming a signal line layer containing a first dielectric material and a conducting metal, the dielectric material can be FR4, Kapton, other dielectric polymers, or other materials with dielectric properties; (ii) etching the conducting metal to form at least one signal line pattern in the signal line layer; (iii) forming a trench layer containing a second dielectric material and a no-flow or low flow prepreg material, the second dielectric material can be the same material as the first dielectric material or a different material and can be FR4, Kapton, or other dielectric polymers or materials; (iv) carving at least one trench cavity pattern through the trench layer wherein the trench cavity pattern matches a signal line pattern etched in the signal line layer, the trench cavity pattern can be carved using methods described in the above specification; (v) forming a ground layer containing a conducting metal and a third dielectric material, the third dielectric material may be the same as the first dielectric material and/or the second dielectric material and can be FR4, Kapton, or other dielectric polymers or materials; (vi) creating a first interconnect substructure using signal line, trench and ground layers; (vii) either forming multiple interconnect substructures using signal line, trench, and ground layers and stacking n-number of substructures together, or, stacking subsequent layers to the substructure in the pattern of trench layer, signal line layer, trench layer, and ground layer such that either a ground layer or a signal line layer completes the stacking process and every signal line layer is arranged adjacent to trench layer(s) with corresponding trench and signal line patterns; and, (viii) pressing, laminating, and sintering the stacked sheets under a specified temperature.

Multilayer boards come with microstrip and stripline-type transmission lines. Mainly striplines are buried into internal layers and microstrip lines are laid on the top layer of the multilayer-PCB. For the construction of either type of transmission lines the following three design components can be used: (1) a signal line layer; (2) a trench layer;

(3) a ground layer. In multi-layered boards with multiple signal line layers dispersed between microstrip and stripline type transmission lines, the orientation of the signal line layers can vary throughout the structure. The signal lines in FIGS. 1-4B and FIGS. 5A and 5B described below all fall generally on the same vertical axis directly above and below one another, and all facing directionally toward the top of the stacked layers. The signal lines can also be staggered along different vertical axes and can face directionally toward the top or the bottom of the stacked layers. In addition, for ease of depiction the drawings show the signal lines as following a straight line pattern across the interconnect. In certain embodiments the signal lines may be etched as patterns matching the manufacturing requirements for the interconnect. The trench layers, carved in a pattern that matches the signal line patterns, track the signal lines and will therefore shift accordingly. The shape of the trench opening can be square, rectangular, trapezoidal, circular, or ellipsoidal where the top opening can be wider, the same as, or smaller than the bottom opening. Noting that the top opening is the one closer to the signal line. The height, or deepness, of the openings can be adjusted based on the bandwidth requirements of the interconnects.

FIG. 1 depicts the three design layers used in the method for manufacturing high speed printed circuit board interconnects. A signal line layer 100 comprises a first dielectric material 105 and a conducting metal 110 which is generally copper but can be other known conducting metals. The dielectric material 105 can be FR4, Kapton, or other known dielectric polymers and materials (described above). The conducting metal 110 is etched away (symbolized by dotted lines 112), forming signal line patterns 115 in the signal line layer 100. There can be one or more signal lines in a signal line layer and the pattern can be a straight line or a more detailed etching depending on the manufacturing requirements for the interconnect. A trench layer 120 comprises a second dielectric material 125 sandwiched between layers of no-flow or low-flow prepreg 130. The second dielectric material 125 can be the same as the first dielectric material 105 or it can be different, and it can be FR4, Kapton, or other known dielectric polymers and materials. The no-flow or low-flow prepreg material 130 can be attached to the dielectric material or it can exist as separate entities combined when the materials are stacked together. The trench is cut (symbolized by dotted lines 135), in a pattern mimicking the signal line patterns 115 in a corresponding signal line layer 100. The ground layer 140 comprises a third dielectric material 145 and a conducting metal 150. The third dielectric material 145 can be FR4, Kapton, or other known dielectric polymers and materials and can be the same or different from the materials selected for the first dielectric material 105 and second dielectric material 125 in the signal line layer 100 and trench layer 120 respectively. FIG. 1 depicts an embodiment of the ground layer 140 where the third dielectric material 145 is combined with only one conducting metal sheet 150.

Figure 2A:
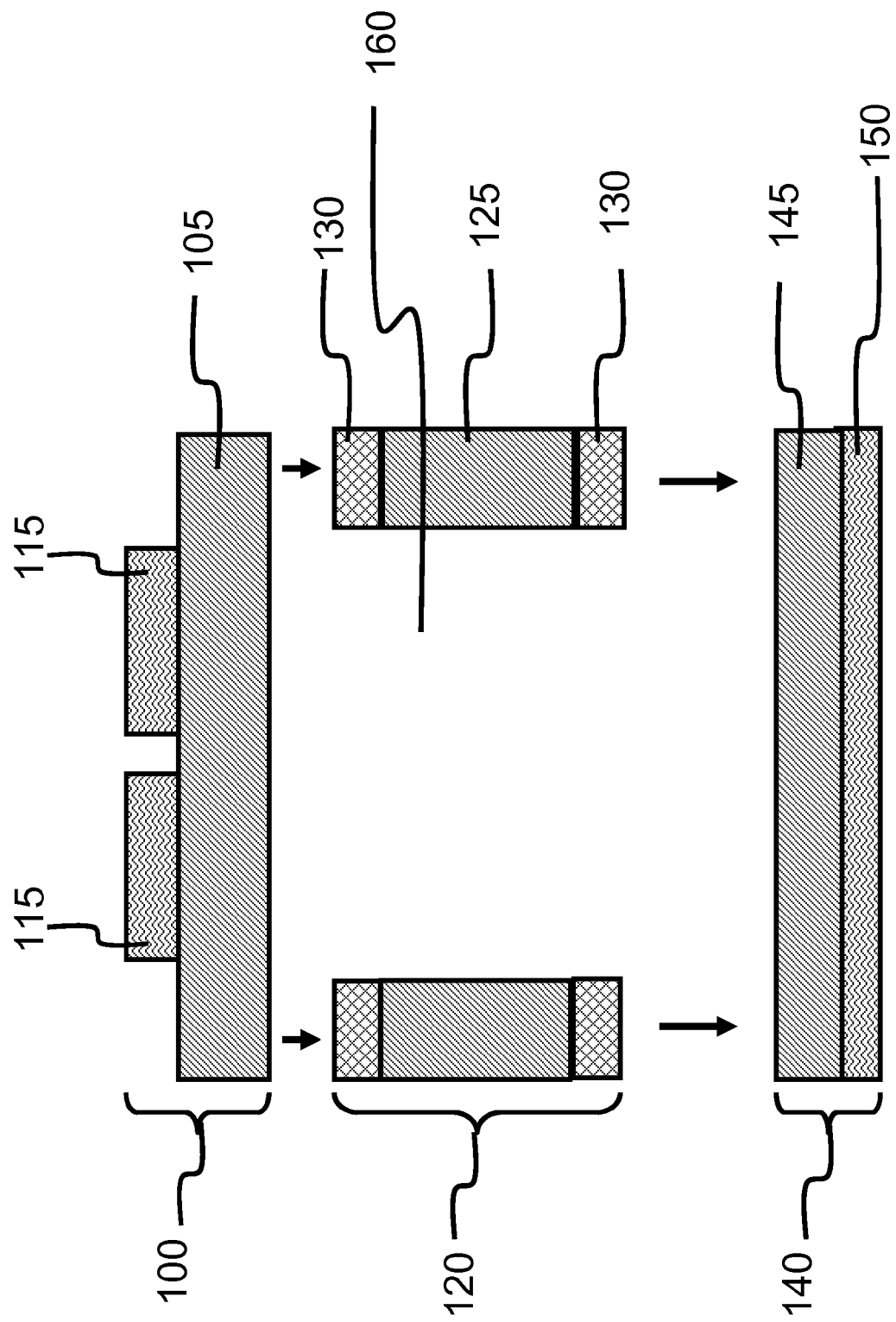
FIG. 2A depicts the method of manufacturing for a microstrip type signal line structure.
Figure 2B:
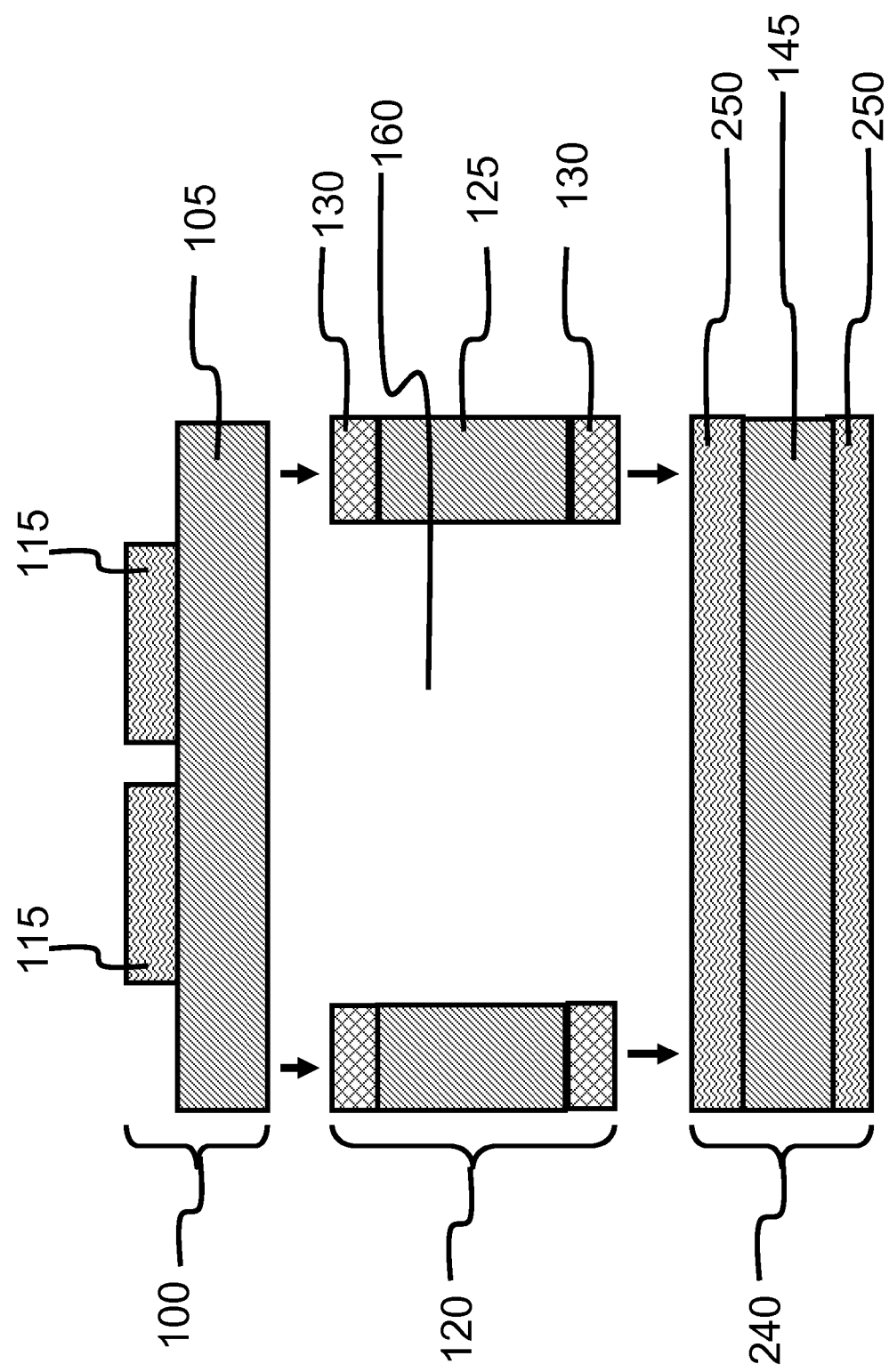
FIG. 2B depicts an alternative embodiment of a method for manufacturing a microstrip type signal line structure.

FIG. 2A depicts the method of manufacturing for a microstrip type signal line structure. At least one signal line pattern 115 comprising copper or other conducting metal and a first dielectric material 105 comprise the signal line layer 100. The dielectric material 105 can be FR4, Kapton, or other known dielectric polymers and materials. The trench layer 120 comprises a second dielectric polymer 125 with a thin layer of no-flow or low-flow prepreg or epoxy on each end 130 which can come separate from the second dielectric polymer 125 or can be attached prior to manufacture. The no-flow or low-flow prepreg or epoxy layers 130 are meant to provide a binding functionality, connecting the second dielectric polymer 125 in the trench layer 120 to the signal line layer 100 and ground layer 140. The open air trench 160 is created by laser drilling or by mechanical through drilling. The ground layer 140 comprises a conducting metal 150 (for example copper or other known conducting metals) along with a third dielectric polymer 145 comprising a dielectric polymer (for example FR4, Kapton or other known dielectric polymers and materials). FIG. 2B depicts an alternative embodiment of a method for manufacturing a microstrip type signal line structure. The dielectric material 145 in the ground layer 240 may be between two conducting metal sheets 250. In this alternative embodiment the make-up of the signal line layer 100 and the trench layer 120 stays consistent with what is described in FIGS. 1 and 2A.

Figure 3:
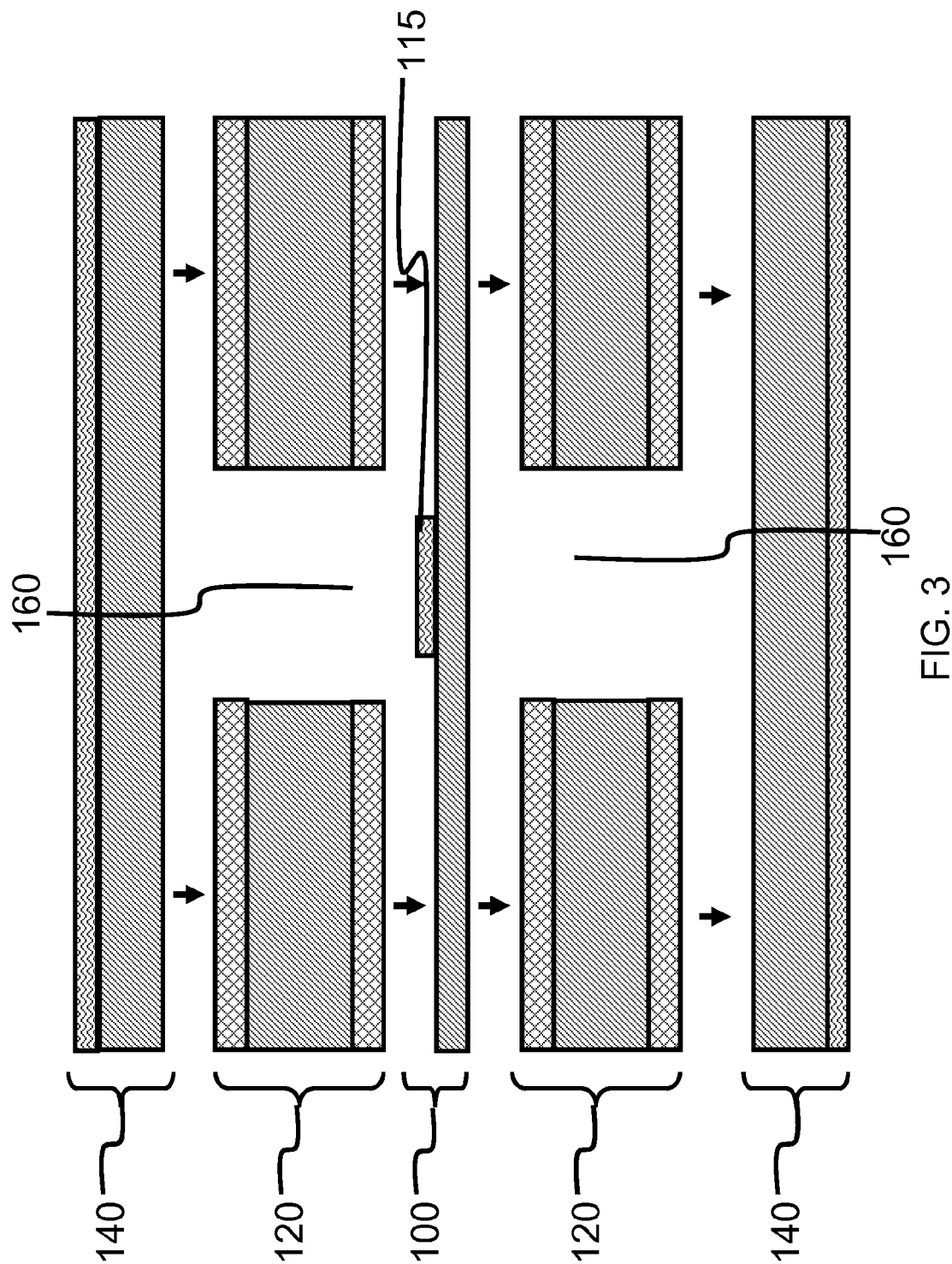
FIG. 3 shows an embodiment of the method for manufacturing a stripline board structure.

FIG. 3 shows an embodiment of the method for manufacturing a stripline board structure. Stripline structure is characterized by a signal line layer 100 embedded within a plurality of trench layers 120 and ground layers 140. The trench layers 120 have trench patterns 160 which correspond to the pattern of the etched signal line 115 in the signal line layer 100. In multiple layer stripline structures, or when stripline and microstrip structures are combined, a signal line layer 100 will have a trench layer 120 above and/or below the signal line 115 and will share a ground layer 140 with the adjacent structure.

FIGS. 1-3 depict the general structures which multi-layered interconnects are based. Generally, multilayered interconnects consist of a combination of microstrip and stripline type signal line layers stacked together. When stacking layers together to create multilayered structures, the stack can have a signal line layer 100 or a ground layer 140 completing both ends of the stack. Trench layers 120 with trench patterns 160 corresponding to etched signal line patters 115 in signal line layers 100 are situated adjacent to each other in the stacks. As will be further described below, the method for manufacturing multilayered structures can be completed either by stacking individual layers according to a pattern, by creating multilayered substructures which are then combined together, or by some combination of the two.

Figure 4A:
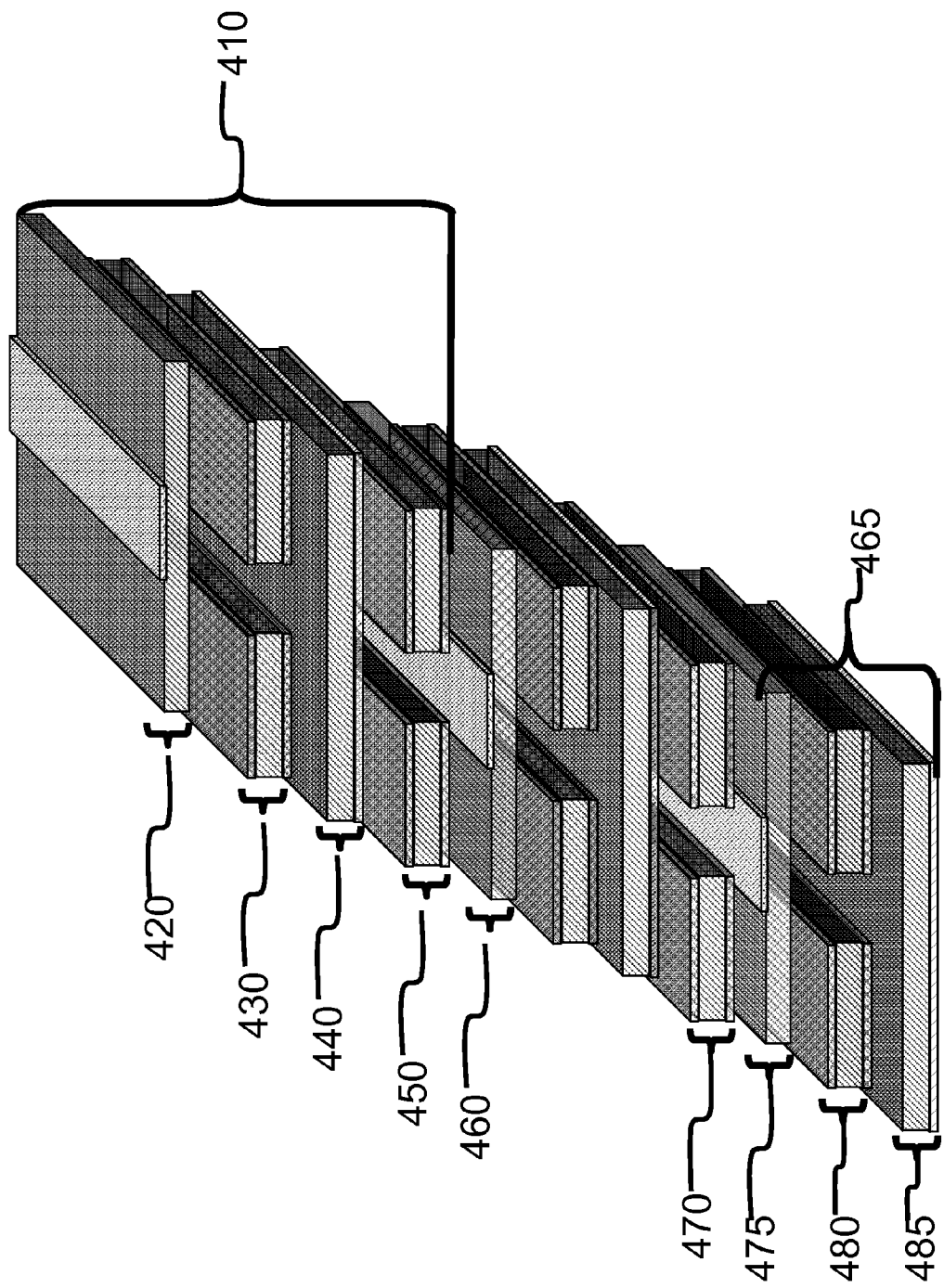
FIG. 4A depicts an expanded, 3-D view of the stacking process for creating multi-layered high speed printed circuit board interconnects.

FIG. 4A depicts an expanded, 3-D view of an embodiment of the current method wherein a multi-layered high speed printed circuit board interconnects stack 400 is created by stacking n-numbers of a pattern 410 of signal line layers, trench layers, and ground layers together. FIG. 4B depicts the cross sectional view of this embodiment. The pattern 410 comprises a signal line layer 420 a first trench layer 430 a ground layer 440 and a second trench layer 450. The pattern 410 is arranged such that, upon stacking, the carved pattern in the second trench layer 450 matches the etched signal line pattern of the signal line layer in the subsequent stacked pattern 460. After stacking the n-number of patterns together the stack 400 requires a completion step. This completion step involves a termination pattern 465 following the second trench layer of the nth numbered stack 470. The termination pattern consists of a signal line layer 475, a trench layer 480, and a ground layer 485. Alternatively, a solitary signal line layer 490 shown in FIG. 4C (both cross sectional and 3D point of view) can replace the termination pattern 465 as the completion step in the stack 400. If the stack is completed with a solitary signal line layer 490 the trench pattern of the second trench layer in the nth-numbered stack 470 will match the signal line pattern of the solitary signal line layer 490.

Figure 4C:
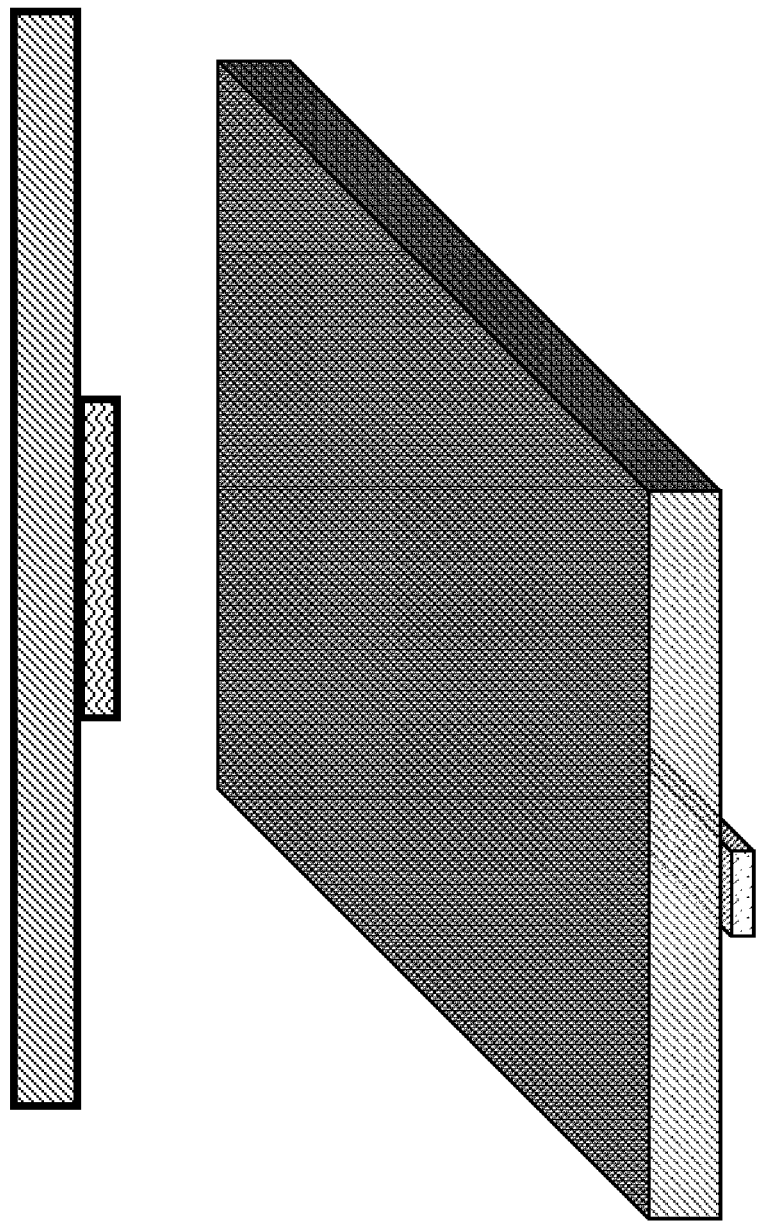
FIG. 4C depicts a 3-D and cross sectional view of a solitary signal line layer which can be used as an alternative completion of a multi-layered high speed printed circuit board interconnect stack as well as an alternative orientation of a signal line layer in a multilayered interconnect.

The structure in FIG. 4C also depicts an alternative orientation of a signal line layer in a multilayered interconnect. Whereas FIGS. 2-4B and FIGS. 5A and 5B show the signal line layer oriented directionally toward the top of the stack, the alternative embodiment in FIG. 4C shows that the signal line layer 490 can be oriented directionally towards the bottom of the stack. Usage of this different orientation 490 may occur according to manufacturing requirements. Additionally, for ease of drawing all signal lines have been depicted as generally falling along the same vertical axis in the multilayered stacks. Alternatively, the signal lines may be situated off-axis from each other.

Figure 5A:
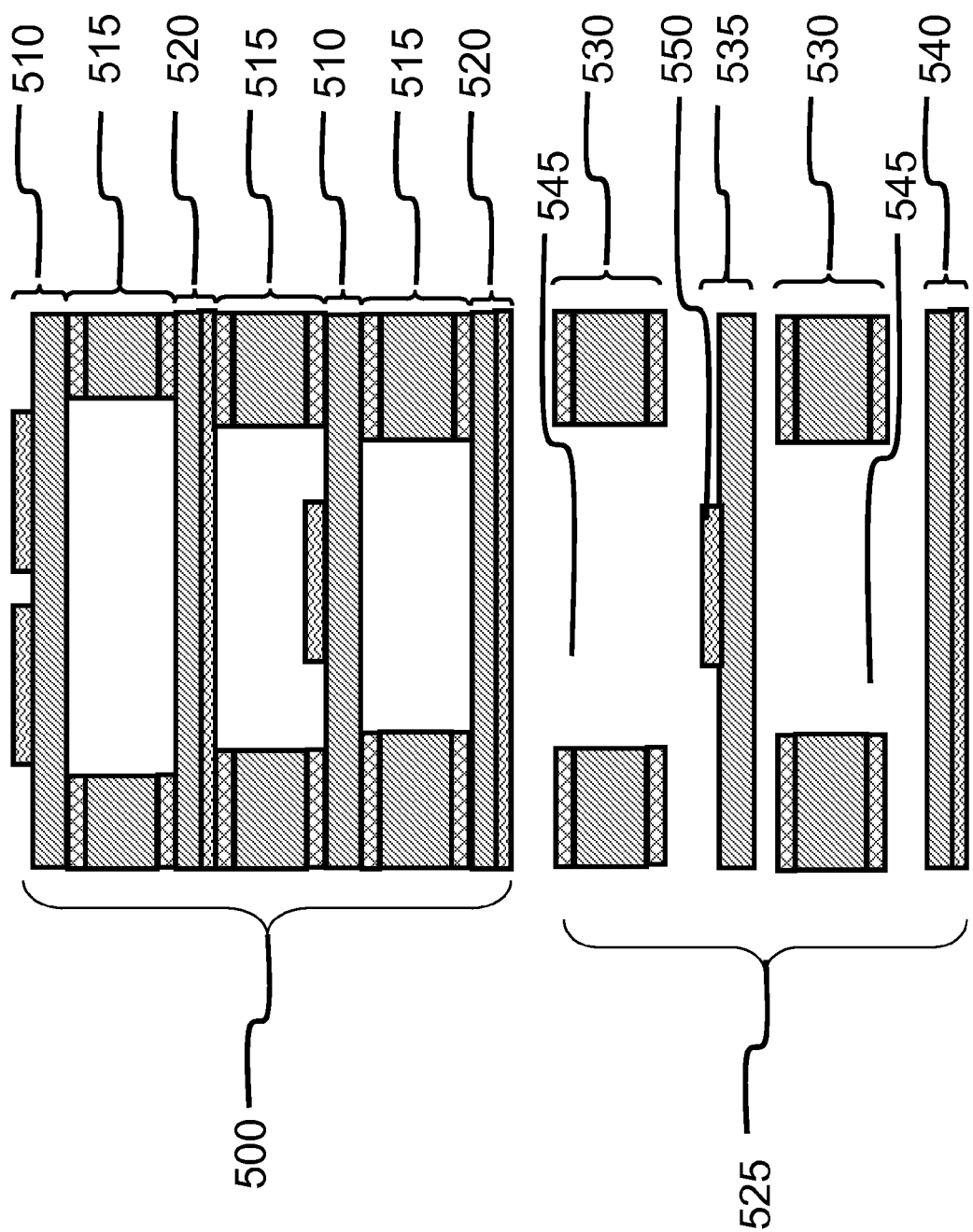
FIG. 5A depicts a method of manufacturing high speed interconnects using an interconnect substructure and layering pattern.

FIG. 5A depicts a method of manufacturing high speed interconnects using an interconnect substructure and subsequent layering pattern. The substructure 500 comprises one or more signal line layers 510, one or more trench layers 515, and one or more ground layers 520. The three different types of layers are stacked together so that any signal line layer 510 is followed and/or preceded by a trench layer 515 and a ground layer 520. After forming the substructure 500, a multilayered board is constructed by stacking subsequent layers to the substructure in the pattern 525 of trench layer 530, signal line layer 535, trench layer 530, ground layer 540, such that either a ground layer 540 or a signal line layer 535 completes the stacking process and every signal line layer is adjacent to a trench layer 530 with a trench pattern 545 corresponding to the signal line pattern 550 in the signal line layer 535.

Figure 5B:
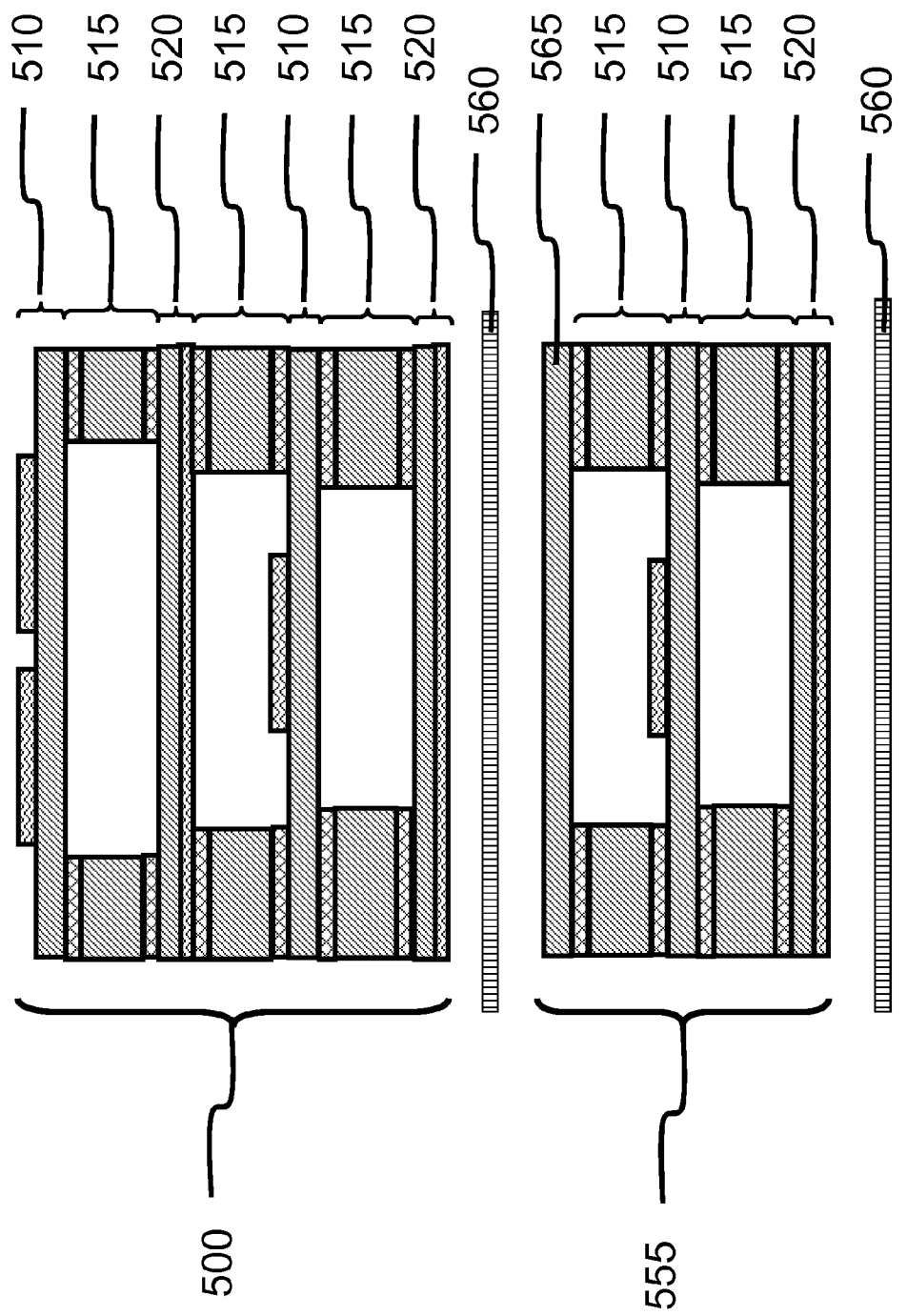
FIG. 5B depicts a method of manufacturing high speed interconnects using n-number of interconnect substructures.

FIG. 5B depicts a method of manufacturing high speed interconnects using n-number of interconnect substructures 500 and 555. The substructures 500 and 555 are formed using the stacking techniques previously described herein. The substructures 500 and 555 are then stacked together with a layer of prepreg 560 in between in order to bind them together. Maintaining shape and consistency of the prepreg 560 used for this process is not an issue so the prepreg 560 can be no-flow, low-flow or flow. When forming multiple substructures it may be necessary to have a layer 565 which is not a signal line layer 510, a trench layer 515, or a ground layer 520. The layer 565 may be a dielectric material or a conducting metal depending on the manufacturing requirements and is meant to provide a stacking pattern similar to that of a process where each layer is stacked individually. The first substructure 500 contains a microstrip type structure or a microstrip and stripline combination. The second substructure 555 will generally comprise a stripline configuration and may also contain a microstrip configuration. A method of manufacturing of this sort may contain n-number of substructure combinations all of which will use the techniques previously described herein. The substructure which completes the stacked combination must end with either a signal line layer 510 or a ground layer 520.

Figure 6:
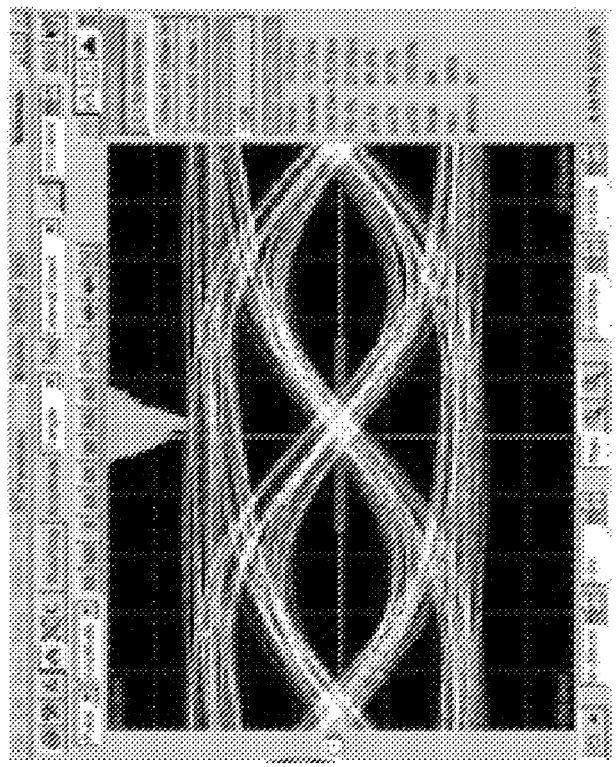
FIG. 6 and FIG. 7 depicts eye-pattern responses for approximately 1-meter long FR4-PCB using interconnects made with the invented process versus conventional interconnects having no trench underneath the signal line, made on the same board using the same PCB materials.
Figure 6:
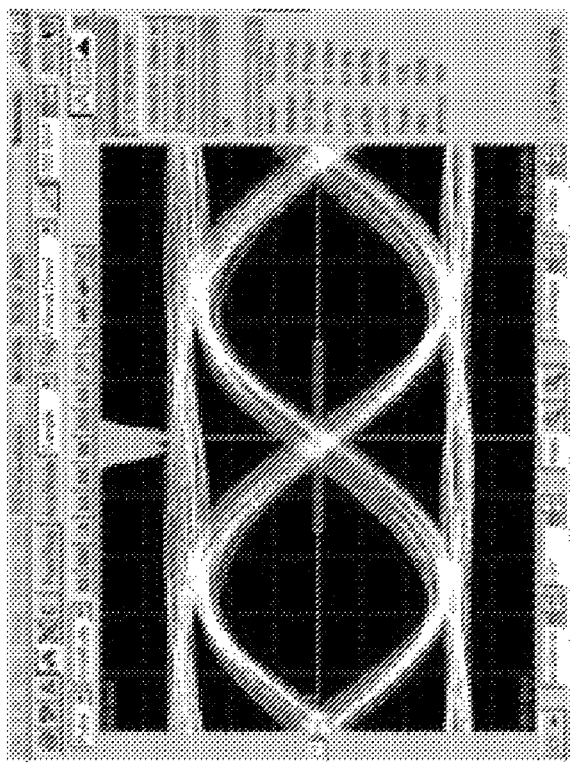
Figure 7:
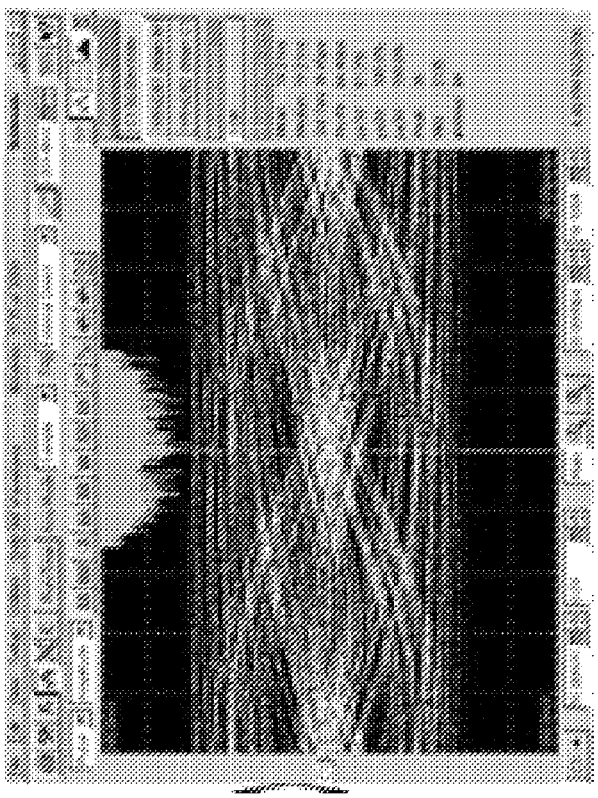
Figure 7:
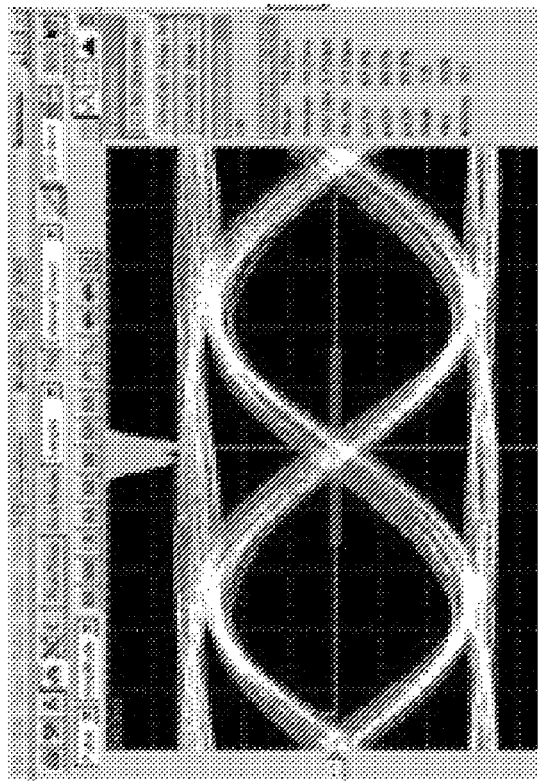

FIG. 6 and FIG. 7 depict eye-pattern responses for approximately 1-meter long FR4-PCB using interconnects made with the invented process versus conventional interconnects having no trench underneath the signal line, made on the same board using the same PCB materials. The images in FIG. 6 and FIG. 7 depict the first demonstration transmitting 10 Gb/s electrical signal through a 1.5-meter long rigid board. The result shows significant signal recovery with the interconnects created using the invented method. FIG. 7 shows the eye-pattern response at 10 Gb/s PRBS input for the standard (i.e. conventional) interconnects fabricated on the same board. The invented method provides an interconnect capable of significantly higher electrical signal carrying capacity that that of an interconnect made with conventional technology. The results show that the interconnects made with the invented technology are able to increase the bandwidth significantly using standard materials. In the other words, interconnects according to this invention can be able to reduce power significantly compared to that of standard interconnects. This is an explanatory diagram to show the advantage of this invention.

Figure 8:
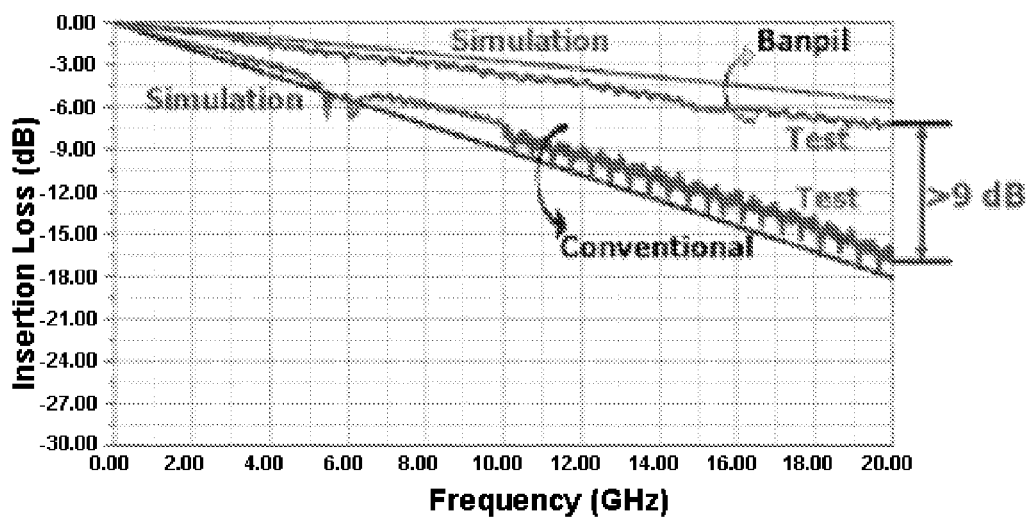
FIG. 8 shows a chart of the insertion losses for single-ended signal lines of conventional types as well as for those made under the present invention.

FIG. 8 shows a chart of the insertion losses for single-ended signal lines of conventional types as well as for those made under the present invention. Differences in insertion losses over 9 dB at 20 GHz are found between the conventional and the present invention. The differences in insertion losses increase with increasing frequencies. This is an explanatory diagram to show the advantage of this invention.

In the embodiments described above, strip line and microstrip configurations are considered. However, in accordance with the present invention, other signal lines not mentioned, such as coplanar line configuration with single or multiple signal lines (as single or differential), are also considered. Dielectric coverage using the same or different dielectric material can also be used.

In the embodiments explained above, the ground plane is located in close proximity to the prepreg and the opened trench. This invention also covers embodiments where the ground plane is not located over (and under) the trench openings. The ground plane can alternatively be located on both vertical sides of the opened-trenches to reduce the interference.

The method and structures made from the present invention can also be used in an interconnect system where both electrical and optical signals can be transmitted using the same signal line. For example, the trench portion is used to reduce the effective dielectric loss and effective dielectric constant. By using the opened backside slot or opened trench the signal line is mostly flowing through the trench filled with air, lower dielectric loss material or coolant. In interconnects where both high speed electrical signals and high speed optical signals are considered, the trench or backside slot can be used for transmitting both signal lines together, and significant bandwidth of the interconnects system with high integration capability can be realized.

The structures created by the disclosed method of manufacture are expected to be used in high-speed on-chip and off-chip interconnects, where signal speeds of 5 Gb/s and beyond are necessary. The structures can also be implemented in the high-speed single or multiple signal connectors, and high-speed cables (not shown). The applications include on-chip interconnects where high-speed electronics chips or electronics chips with optical chips need to be connected. Ideally the bandwidth of the interconnect system can be made close to fiber, future monolithic integration of electronics and optical chips can also be interconnected without sacrificing the chip's speed. The application also includes high speed multichip module interconnection, 3-D chip or memory interconnection, high speed parallel system for computer animation and graphics for high speed 2-D or 3-D video transmission, and high bandwidth image display, high speed router where high speed electronics switches (or IC) are needed to be interconnected. The applications also include the high speed (5 Gb/s and beyond) connectors and cables for high speed board-to-board, rack-to-rack interconnection, and also single or multiple high-density signal connections and carrying from one side to the other in longer path.

Although the invention has been described with respect to specific embodiments for a complete and clear understanding of the disclosure, the appended claims are not to be thus limited but are to be construed as embodying all modification and alternative constructions that may occur to one skilled in the art which fairly fall within the basic teaching here set forth.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims along with this patent.

The invention claimed is:

1. A method of manufacturing high speed printed circuit board interconnects comprising:
    forming a signal line layer comprising a first dielectric material and a conducting metal;
    etching the conducting metal to form a signal line pattern in said signal line layer;
    forming a trench layer comprising a second dielectric material and a no-flow or low flow prepreg material;

carving a trench cavity pattern through said trench layer, wherein said trench cavity pattern substantially matches said signal line pattern;

forming a ground layer comprising a conducting metal and a third dielectric material; and stacking said signal line layer, said trench layer, and said ground layer such that said signal line layer is adjacent to said trench layer and said trench pattern is aligned with said signal line pattern.

2. The method of claim 1, further comprising the step of pressing, laminating, and sintering the stacked layers under a specified temperature.

3. The method of claim 1 further comprising the step of placing the signal line, trench, and ground layers under a specified temperature and pressure prior to stacking.

4. The method of claim 1 further comprising the step of placing the signal line, trench, and ground layers in vacuum prior to stacking.

5. The method of claim 1, further comprising the step of filling the trench cavity with liquid coolant.

6. The method of claim 1, wherein said first, said second, and said third dielectric materials are the same material.

7. A method of manufacturing high speed printed circuit board interconnects comprising:

forming a substructure comprising the steps of:
forming a first signal line layer comprising a dielectric material and a conducting metal;
etching the conducting metal to form a signal line pattern in said first signal line layer;
forming a first trench layer comprising a dielectric material and a no-flow or low flow prepreg material;
carving a trench cavity pattern through said first trench layer, wherein said trench cavity pattern substantially matches the signal line pattern of said first signal line layer;
forming a first ground layer comprising a conducting metal and a dielectric material;
forming a second trench layer comprising a dielectric material and a no-flow or low flow prepreg material; and
carving a trench cavity pattern through said second trench layer;
stacking said first signal line layer, said first trench layer, said first ground layer, and said second trench layer such that the trench pattern of said first trench layer is aligned with the signal line pattern of said first signal line layer;

completing the structure comprising the steps of:
forming a second signal line layer comprising a dielectric material and a conducting metal;
etching the conducting metal to form a signal line pattern in said second signal line layer;
stacking said substructure and said second signal line layer such that the second trench layer of said substructure is adjacent to said second signal line layer, and the trench pattern of said second trench layer of said substructure is aligned with the signal line pattern of said second signal line layer, wherein the signal line pattern of said second signal line layer substantially matches the trench pattern of the second trench layer of the adjacent substructure; and
pressing, laminating, and sintering the stacked layers under a specified temperature.

8. The method of claim 7, further comprising the steps of: performing said step of forming a substructure a plurality of times; and stacking the resulting substructures, wherein the signal line pattern of each said first signal line layer of the resulting plurality of substructures substantially matches the trench cavity pattern of any adjacent second trench layer of any adjacent substructure.

9. The method of claim 7, wherein said step of completing the structure further comprises:
forming a third trench layer comprising a dielectric material and a no-flow or low flow prepreg material;
carving a trench cavity pattern through said third trench layer wherein the trench cavity pattern substantially matches the signal line pattern of said second signal line layer;
forming a second ground layer comprising a conducting metal and a dielectric material;
stacking said substructure, said second signal line layer, said third trench layer, and said second ground layer such that the trench pattern of said third trench layer is aligned with the signal line pattern of said second signal line layer.

10. The method of claim 7, further comprising the step of placing all signal line, trench and ground layers under a specified temperature and pressure prior to stacking.

11. The method of claim 7, further comprising the step of placing all signal line, trench, and ground layers in vacuum prior to stacking.

12. The method of claim 7, further comprising the step of filling the trenches with liquid coolant.

13. The method of claim 7, wherein the location of the signal line patterns are staggered across the different signal line layers.

14. The method of claim 7, wherein all signal line patterns in the signal line layers face the same direction.

15. A method of manufacturing multi-layered high speed printed circuit board interconnects comprising the steps of:
forming a signal line layer comprising a dielectric material and a conducting metal;
etching the conducting metal to form a signal line pattern in the signal line layer;
forming a trench layer comprising a dielectric material and a no-flow or low flow prepreg material;
carving a trench cavity pattern through the trench layer wherein the trench cavity pattern matches the signal line pattern etched in the signal line layer;
forming a ground layer comprising a conducting metal and a dielectric material;
creating an interconnect substructure using a combination of signal line, trench and ground layers;
stacking subsequent components to said interconnect substructure;
pressing, laminating, and sintering the stacked sheets under a specified temperature.

16. The method of claim 14 wherein the subsequent components stacked to the substructure are additional interconnect substructures.

17. The method of claim 14 wherein the subsequent components stacked to the first substructure are additional signal line, trench, and ground layers.

18. The method of claim 14 further comprising the step of placing all signal line, trench, and ground layers under a specified temperature and pressure prior to stacking.

19. The method of claim 14 further comprising the step of placing all signal line, trench, and ground layers in vacuum prior to stacking.

20. The method of claim 14 further comprising the step of filling the trench with liquid coolant.

* * * * *